(12) United States Patent
Cron et al.

(10) Patent No.: US 12,724,065 B1
(45) Date of Patent: Sep. 1, 2026

(54) MANUFACTURING AUTOMATIC TEST EQUIPMENT AND FIELD AMBIENT COMPARISON WITH SILICON LIFECYCLE MANAGEMENT SUPPORT

(71) Applicant: Synopsys, Inc., Sunnyvale, CA (US)

(72) Inventors: Adam D. Cron, Hilton Head Island, SC (US); Tomer Y. Morad, New York, NY (US); Salvatore Talluto, Gavirate (IT)

(73) Assignee: Synopsys, Inc., Sunnyvale, CA (US)

( * ) Notice: Subject to any disclaimer, the term of this patent is extended or adjusted under 35 U.S.C. 154(b) by 229 days.

(21) Appl. No.: 18/647,784

(22) Filed: Apr. 26, 2024

(51) Int. Cl.
*G01R 31/28* (2006.01)
*G01R 31/319* (2006.01)

(52) U.S. Cl.
CPC ..... *G01R 31/2834* (2013.01); *G01R 31/2831* (2013.01); *G01R 31/2886* (2013.01); *G01R 31/2889* (2013.01); *G01R 31/31924* (2013.01)

(58) Field of Classification Search
CPC ............ G01R 31/2834; G01R 31/2884; G01R 31/2886; G01R 31/2831; G01R 31/2889; G01R 31/31924
USPC ..................................................... 324/762.01
See application file for complete search history.

(56) References Cited

U.S. PATENT DOCUMENTS 8,914,689 B2 12/2014 Marinissen et al.
2002/0059543 A1* 5/2002 Cheng .................... G11C 29/50 714/30
2011/0026340 A1* 2/2011 Kudou ................... G11C 29/38 365/201
2012/0124435 A1* 5/2012 Eaton ............. G01R 31/318536 714/E11.155
2015/0262710 A1* 9/2015 Chakravarty .......... G11C 29/38 714/718
2019/0180837 A1* 6/2019 Ok ......................... G11C 29/38

* cited by examiner

*Primary Examiner* — Raul J Rios Russo
(74) *Attorney, Agent, or Firm* — Laxman Sahasrabuddhe; Park, Vaughan, Fleming & Dowler LLP

(57) ABSTRACT

A first profile associated with a first circuit may be obtained by running a first test (which may be a shmoo test) on the first circuit. Running the first test on the first circuit may include: selecting an operating condition for testing the first circuit, where the operating condition includes noise and voltage drop conditions to be used during testing; selecting a set of circuits in proximity to the first circuit based on the noise and voltage drop conditions; running built-in self-test (BIST) on the set of circuits to generate the noise and voltage drop conditions in the first circuit; running BIST on the first circuit while BIST is running on the set of circuits; determining a first result of running the BIST on the first circuit; and associating the first result with the operating condition.

20 Claims, 9 Drawing Sheets

MANUFACTURING AUTOMATIC TEST EQUIPMENT AND FIELD AMBIENT COMPARISON WITH SILICON LIFECYCLE MANAGEMENT SUPPORT

TECHNICAL FIELD

The present disclosure generally relates to testing and verification of an integrated circuit (IC). More specifically, the present disclosure relates to manufacturing automatic test equipment and field ambient comparison with silicon lifecycle management support.

BACKGROUND

A built-in self-test (BIST) can test a circuit in an IC chip. The BIST may generally be run at any desired time, including, but not limited to, periodically, upon power-up, or in response to the occurrence of an internal or external condition.

BRIEF DESCRIPTION OF THE FIGURES

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
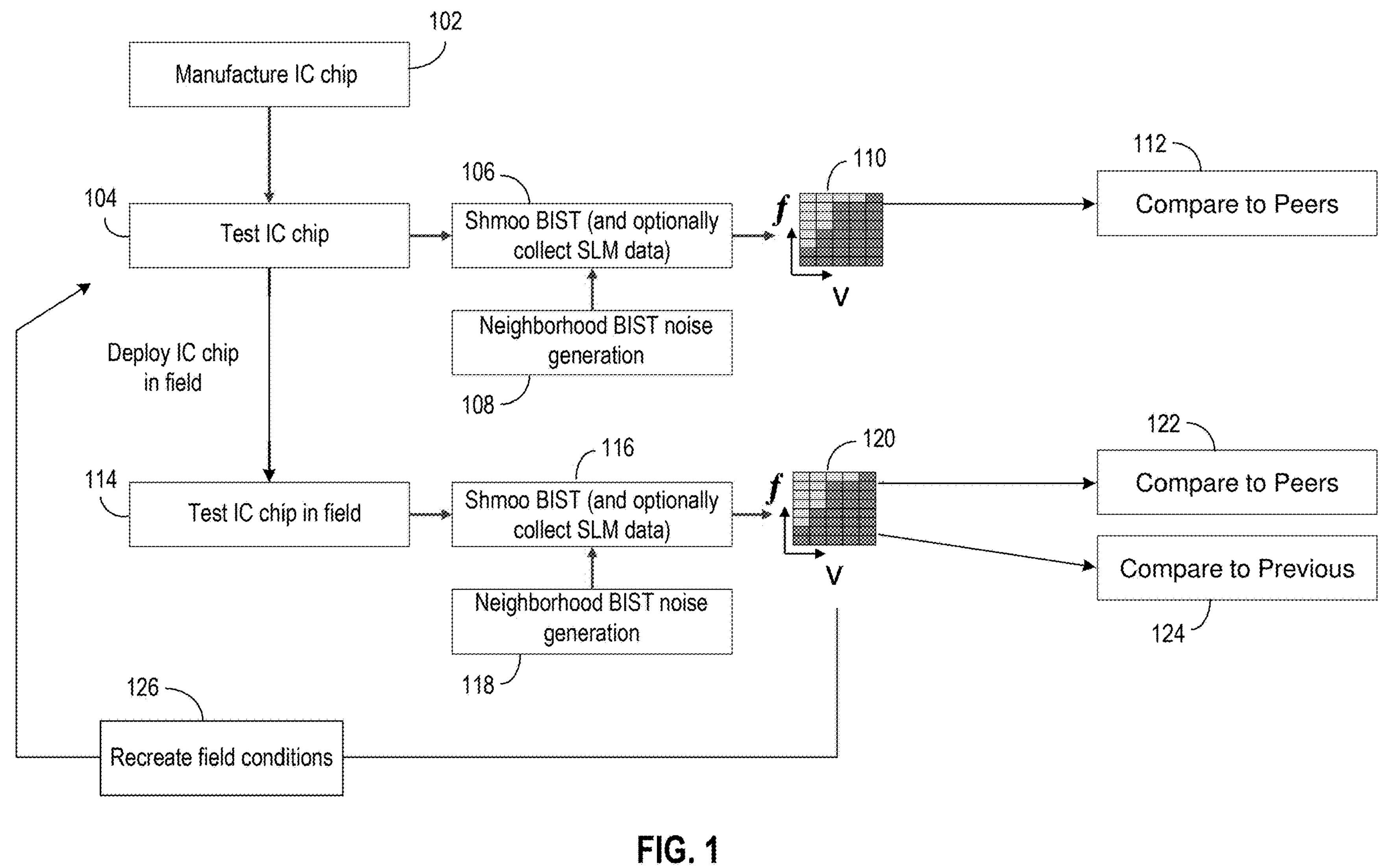
FIG. 1 illustrates a process for using neighborhood BIST noise generation for characterizing IC chips in accordance with some embodiments described herein.

Aspects of the present disclosure relate to manufacturing automatic test equipment and field ambient comparison with silicon lifecycle management support. An IC chip may include one or more BIST engines which can execute a BIST on a circuit (which may include, but is not limited to, a memory or a processor core) in the IC chip. Automatic test equipment (ATE) or a tester may communicate with a BIST engine in an IC chip via an interface. The ATE may use the BIST engine to test a circuit in the IC chip and collect diagnostic data. The diagnostic data may be communicated from the BIST engine to the ATE by using an interface for further analysis. Alternatively, the BIST engine may be instructed to perform a BIST test by a test controller circuit in the IC chip, and the diagnostic data may be collected and communicated by the test controller circuit to an off-chip entity (e.g., an analysis system) via a communication channel.

A BIST engine may perform a sequence of operations on a circuit or apply a sequence of input patterns to a circuit under test (CUT) in the IC chip and check the response with an expected response to determine whether the CUT is operating as desired. A BIST engine may use a pseudo-random pattern generator to generate an entire test pattern sequence from one or more seeds which may be stored on the chip.

Once an IC design has been finalized, the IC design may be provided to a semiconductor manufacturer (i.e., foundry) for volume manufacturing. During volume manufacturing, IC dies may be tested to collect pass/fail (also known as go/no-go) status of the circuits in an IC chip. Typically, when a device is manufactured and tested, the environment (voltage, signal integrity, temperature) under which that test is applied is purer than when the device is used in the field. The term "device" is used in this disclosure to generally refer to a circuit or a portion of a circuit (e.g., a logic gate). Consequently, certain defects may only occur in the field and may not be detected before the IC chip is already deployed in the field. For example, datacenter server farms have been plagued by an insidious defect, which is referred to as the Silent Data Corruption (SDC) issue in the datacenter industry. The fact that the operating conditions used during manufacturing test are different from the operating conditions in the field may be a source of these defects (which are referred to as test escapes because the manufacturing test fails to detect these defects).

Embodiments described herein may provide a well-controlled way to deliver a specific and repeatable amount of noise local to a CUT. In some embodiments described herein, BIST may be run in devices near the CUT while also running BIST (or some other test) in the CUT. Embodiments described herein may be used for device characterization and defect detection. The characterization may be used to detect defects in other instances of the CUT, or in the same CUT at a different time or under different operating conditions.

Technical advantages of embodiments described herein include, but are not limited to, (1) leveraging BIST circuitry (which is already present in the IC chip to perform BIST) to both run the test on the CUT and create disruptions to the test environment (e.g., by adding noise and/or voltage drop by running BIST on circuits that are in the neighborhood of the CUT), (2) substantially reducing or eliminating SDC test escapes, (3) leveraging BIST circuitry (which is already present in the IC chip to perform BIST) to perform a shmoo test on a CUT by varying one or more operating conditions (e.g., by adding noise and/or voltage drop) to obtain a characterization profile, and using the characterization profile to detect degradation of one or more instances of the CUT in the field, and (4) obtaining a characterization profile in the field and using the characterization profile to recreate operating conditions in the factory which are substantially similar to the operating conditions in the field.

FIG. 1 illustrates a process for using neighborhood BIST noise generation for characterizing IC chips in accordance with some embodiments described herein.

An IC chip may be manufactured (at 102), and the IC chip may be tested (at 104) by the semiconductor manufacturer before the IC chip is deployed in the field. Specifically, neighborhood BIST noise generation 108 may be used during a shmoo BIST 106. The term "shmoo" may refer to a test where one or more parameters are varied over a range during the test. The term "shmoo BIST" may refer to a BIST test in which one or more parameters are varied over a range during the test. For example, a shmoo BIST may execute a BIST on a CUT in the IC chip for different operating voltages and frequencies. In some embodiments described herein, the amount of noise introduced in proximity to the CUT may be shmooed (i.e., varied) while BIST is executed on the CUT. The result of performing shmoo BIST 106 may be a characterization or profile 110 which includes the pass/fail results of the CUT under different conditions. The profile 110 for a CUT may be compared with its peers (at 112), i.e., with the profiles for other CUT instances. Defective CUT instances may be detected based on the comparison. If the CUT includes silicon lifecycle management (SLM) circuitry, then the SLM data may be optionally collected and stored with profile 110.

Profile 110 may generally have multiple dimensions, where each dimension may correspond to a parameter which may be varied during the shmoo test. In other words, profile 110 may be defined over a multi-dimensional space, and the shmoo test may be performed at a set of points in the multi-dimensional space. For example, suppose the dimensions are frequency, voltage, and noise, and suppose each dimension is swept through 5 distinct values. In this example, the shmoo test may be performed at $5\times5\times5=125$ different operating conditions. The 125 pass/fail test results (or a subset of the 125 pass/fail test results) may be stored in the profile 110. If the CUT includes SLM circuitry, then the SLM data corresponding to the 125 different operating conditions may be optionally collected and stored with profile 110.

After the IC chip is tested by the manufacturer, it may be deployed in the field, e.g., in a datacenter. The IC chip may be tested in the field (at 114) by executing a shmoo BIST 116 on a CUT in the IC chip, where the shmoo BIST may use neighborhood BIST noise generation 118 to vary the amount of noise introduced in the CUT by circuits in proximity to the CUT. The result of performing shmoo BIST 116 may be a profile 120 which includes the pass/fail results of the CUT under different conditions. The profile 120 for a CUT may be compared with its peers in the field (at 122), i.e., with the profiles for other CUT instances in the field. Alternatively, the profile for a CUT may be compared with the profile for the same CUT which was obtained in the past. Defective CUT instances in the field or degradation of a CUT over time may be detected based on the comparison. If the CUT includes silicon lifecycle management (SLM) circuitry, then the SLM data may be optionally collected in the field and stored with profile 120. Profile 120 may be used by the semiconductor manufacturer to recreate field conditions (at 126) while testing IC chips (at 104) to substantially reduce or eliminate test escapes.

Embodiments described herein may generally be used with IC chips which include multiple circuits (which may or may not be identical) on which BIST may be run. Due to systemic degradation of a circuit, a BIST might fail due to marginal devices degrading enough to become failing devices. The term "marginal device" may refer to a device which barely passes a test. When a BIST runs on a circuit, the circuit may generate signal noise and voltage drop in the IC chip. Typically, when BIST is run on a circuit, other circuits may be switched off or to a standby mode to conserve power and to enable BIST to use more current than might otherwise be available when the other circuits are also operational. Embodiments described herein execute BIST on other circuits (which are not being tested when BIST is run on the CUT) to increase the amount of noise under which the BIST is being run on the CUT. Increasing the amount of noise may cause a marginal device in the CUT to fail during BIST, while other devices in the CUT may pass which have better signal and design characteristics (e.g., better manufacturing quality).

FIGS. 2A-2F illustrates neighborhood BIST noise generation in accordance with some embodiments described herein.

Figure 2A:
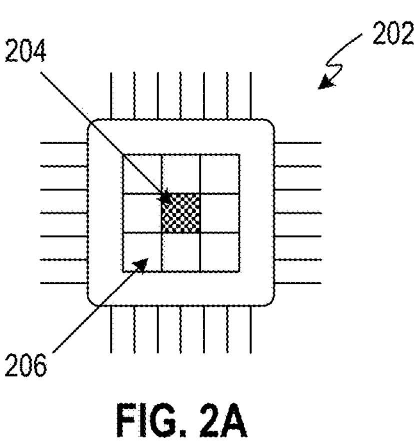
FIGS. 2A-2F illustrates neighborhood BIST noise generation in accordance with some embodiments described herein.

IC chip 202 may include nine circuits (such as circuits 204 and 206 shown in FIG. 2A) which may or may not be identical to each other. When a particular circuit, e.g., circuit 204, is desired to be tested, BIST may be run on the circuit. Additionally, a noise and voltage drop may be injected into circuit 204 by simultaneously running BIST on one or more neighboring circuits. In some embodiments described herein, the amount of noise may be shmooed (i.e., varied) by simultaneously running BIST on different sets of neighboring circuits to inject a varying amount of noise and voltage drop into the CUT. In FIGS. 2A-2F, a CUT on which BIST is being run to test the CUT is shaded darkly, while a circuit on which BIST is being run to inject noise and voltage drop into the CUT is shaded lightly. A circuit that is not running BIST is not shaded. For example, in FIGS. 2A-2F, circuit 204 is the CUT on which BIST is being run for testing. In FIG. 2A, circuit 206 is not shaded because BIST is not being run on circuit 206. However, in FIG. 2B, circuit 206 is lightly shaded because BIST is being run on circuit 206 to inject noise and voltage drop into circuit 204.

Figure 2B:
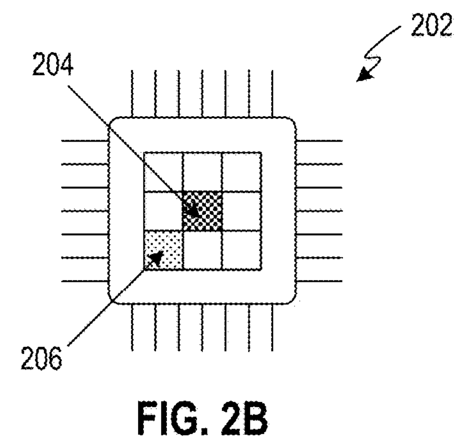

In FIG. 2A, BIST may be run on circuit 204 but not on any of the neighboring circuits, which may correspond to the lowest noise and voltage drop conditions. In FIG. 2B, BIST may be run on circuit 204 to test the circuit, and BIST may also be simultaneously run on circuit 206 to inject a low level of noise and voltage drop into circuit 204. In other words, BIST is run on both circuit 204 and 206, but for different reasons. On circuit 204, BIST is being run to test the circuit, whereas on circuit 206, BIST is being run to inject noise and voltage drop into circuit 204 while circuit 204 is being tested.

Figure 2C:
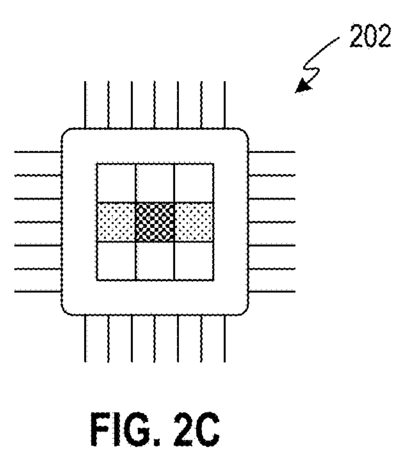
Figure 2D:
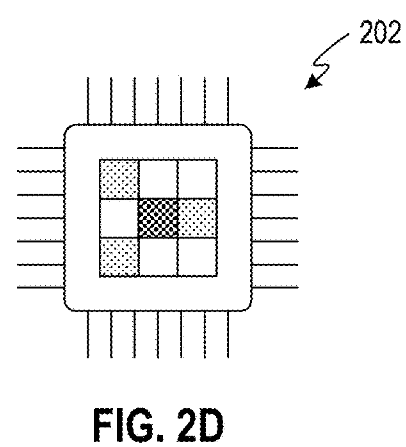
Figure 2E:
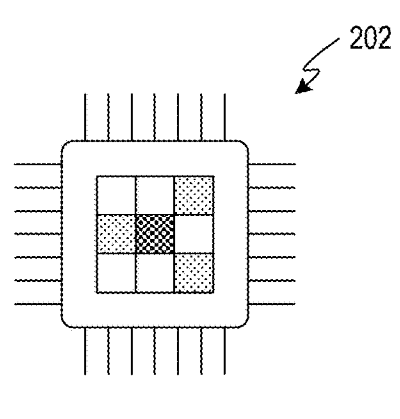
Figure 2F:
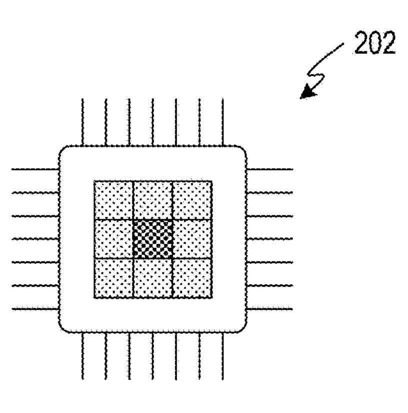

FIG. 2C illustrates BIST being run on two neighboring circuits and FIGS. 2D-2E illustrates BIST being run on three neighboring circuits. FIG. 2F illustrates BIST being run on all neighboring circuits, which may correspond to a maximum amount of noise and voltage drop being injected into the CUT. In some embodiments described herein, BIST may be run on multiple sets of neighboring circuits. For example, FIGS. 2D-2E run BIST on two different sets of three neighboring circuits. The amount of noise and voltage drop injected into circuit 204 in FIGS. 2D-2E may depend on the specific set of neighboring circuits in which BIST is being run. The BIST pass/fail result for each specific set of neighboring circuits may be stored separately. For example, the pass/fail result for FIG. 2D may be associated with the specific set of neighboring circuits shown in FIG. 2D, and the pass/fail result for FIG. 2E may be associated with the specific set of neighboring circuits shown in FIG. 2E.

In some embodiments described herein, the level of noise and voltage drop generated by BIST may be modulated by adjusting the shift values used for the BIST. For example, certain BIST implementations may be programmed using control functions to generate different shift values. For example, a control function which causes the shifted values not to toggle on several consecutive shift operations would lower the switching activity of the shifted values, thus lowering the noise and voltage drops produced by those values. In these embodiments, the noise and voltage drop level in a shmoo test may depend on the specific set of neighboring circuits on which BIST is being run, and the shift values used in each of the BISTs which are running on the specific set of neighboring circuits.

Figure 3:
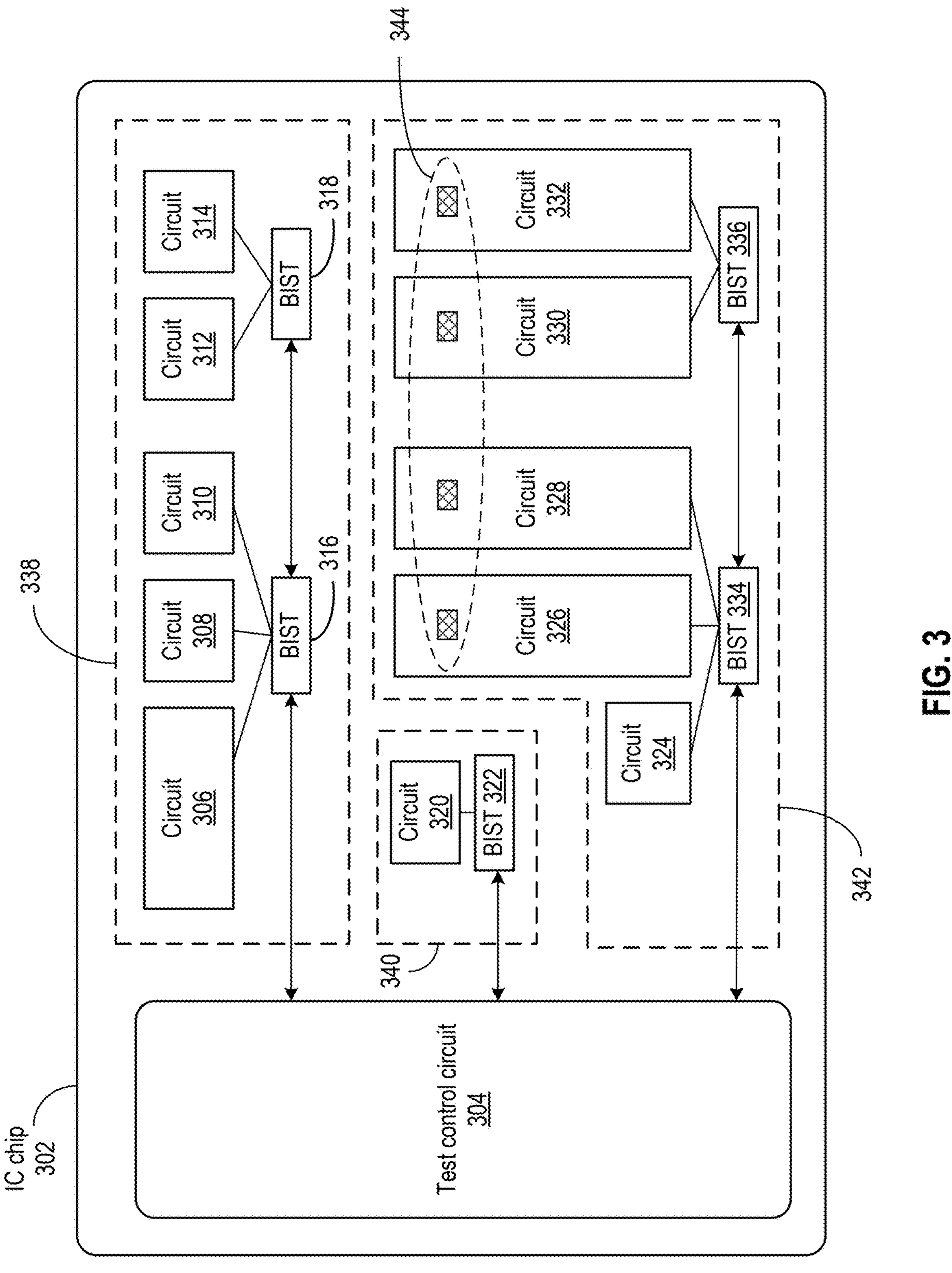
FIG. 3 illustrates circuitry for neighborhood BIST noise generation in accordance with some embodiments described herein.

FIG. 3 illustrates circuitry for neighborhood BIST noise generation in accordance with some embodiments described herein.

IC chip 302 may include multiple circuit blocks, e.g., circuit blocks 338, 340, and 342. Each circuit block may include multiple circuits which may be tested using BIST, e.g., circuit block 338 may include circuits 306, 308, 310, 312, and 314, circuit block 340 may include circuit 320, and circuit block 342 may include circuits 324, 326, 328, 330, and 332. IC chip 302 may include a set of BIST engines, e.g., BIST engines 316, 318, 322, 334, and 336. A set of circuits may be associated with a BIST engine, e.g., circuits 306, 308, and 310 are associated with BIST engine 316. A BIST engine may be used to run BIST on circuits that are associated with the BIST engine, e.g., BIST engine 316 may be used to run BIST on circuits 306, 308, and 310. The BIST engines may be controlled by test control circuit 304 to run a BIST on a circuit to apply noise and voltage drop conditions and/or to run a shmoo test and generate a profile.

Test control circuit 304 may store the results of running a BIST test and/or a shmoo test, and the results (e.g., profiles) may be communicated to an off-chip entity through a communication channel (not shown in FIG. 3). Test control circuit 304 may instruct a BIST engine (e.g., BIST engine 316) in IC chip 302 to execute a BIST on one or more circuits (e.g., circuits 306 and 308) which are associated with the BIST engine. Once a BIST engine (e.g., BIST engine 316) receives the begin execution instruction from test control circuit 304, the BIST engine may begin a BIST run on one or more circuits which are associated with the BIST engine. For example, upon receiving the begin execution instruction, BIST engine 316 may begin a BIST run on circuit 308. Once a BIST engine (e.g., BIST engine 316) completes execution of the BIST on a circuit (e.g., circuit 308), the BIST engine may provide the pass/fail results to test control circuit 304. In some embodiments, test control circuit 304 may include a set of registers which may store parameters for performing the BIST test and/or shmoo test. Specifically, the set of registers may specify how to inject noise and voltage drop (e.g., the specific sets of neighboring circuits to run BIST on, and the shift values to use in the BIST runs) while performing the BIST test and/or may specify the number of dimensions and the range of values over which the shmoo test is to be performed.

Test control circuit 304 may periodically perform a BIST or shmoo test or may be instructed to do so by an off-chip entity (not shown in FIG. 3). When test control circuit 304 runs BIST on a circuit, test control circuit 304 may also run BIST on one or more neighboring circuits depending on the amount of noise and voltage drop that is to be injected into the CUT. When test control circuit 304 runs a shmoo test on a circuit, test control circuit 304 may perform multiple BIST runs on the circuit, where in each BIST run, test control circuit 304 may run BIST on different sets of neighboring circuits, thereby varying the amount of noise and voltage drop that is injected into the CUT. For example, when test control circuit 304 runs BIST on circuit 308, test control circuit 304 may also instruct one or more BIST engines to run BIST on neighboring circuits (e.g., one or more of circuits 306, 310, 320, 326, and 328) depending on specific set of neighboring circuits which are to be used for injecting noise and voltage drop into circuit 308 during BIST.

In some embodiments described herein, IC chip 302 may include SLM circuitry. For example, SLM circuitry 344 may be included in circuits 326, 328, 330, and 332. SLM circuitry may measure one or more metrics which may be useful to gain insight on how circuits or devices are performing in the field. Metrics measured by SLM circuitry may include, but are not limited to, process conditions, voltage conditions, temperature conditions, timing margin, and clock delay. The measurement data from the SLM circuitry may be stored as part of the shmoo profiles. For example, test control circuit 304 may receive measurement data from SLM circuitry 344, and test control circuit 304 may store the SLM measurement data with the BIST pass/fail results for each point in the multi-dimensional operating condition space which is swept during the shmoo test.

Figure 4:
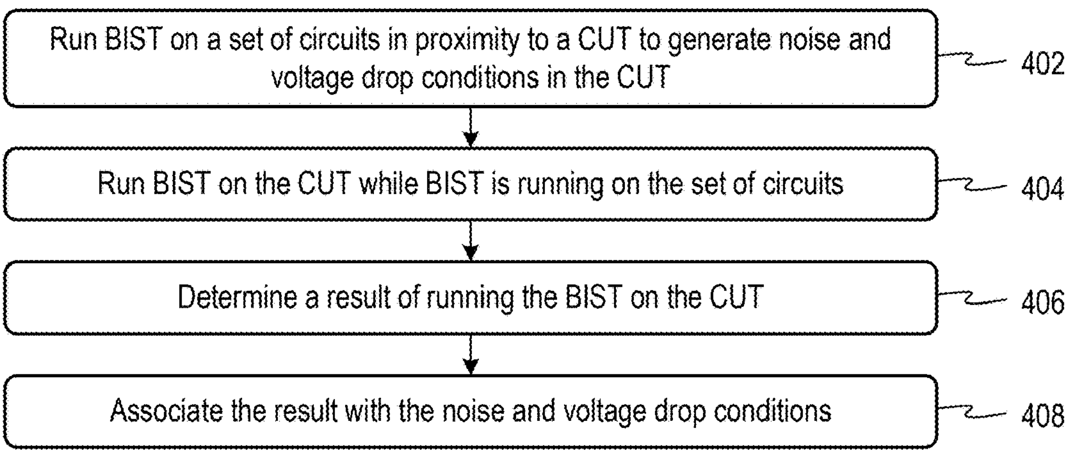
FIG. 4 illustrates a process for neighborhood BIST noise generation in accordance with some embodiments described herein.

FIG. 4 illustrates a process for neighborhood BIST noise generation in accordance with some embodiments described herein.

BIST may be run on a set of circuits in proximity to a CUT to generate noise and voltage drop conditions in the CUT (at 402). For example, in FIG. 3, circuit 308 may be the circuit which is desired to be tested (i.e., circuit 308 may be the CUT), and BIST may be run on circuits 306 and 310 to generate noise and voltage drop conditions in circuit 308. In some embodiments described herein, a test pattern set, or a functional test may be used instead of BIST.

In some embodiments described herein, noise and voltage drop conditions may be represented using an identifier which corresponds to the set of circuits and/or shift values which are used to run BIST in the set of circuits.

The amount and pattern of noise and voltage drop conditions generated in the CUT may be different for different sets of circuits, and may not necessarily correspond to the number of neighboring circuits in which BIST is being run. Therefore, in some embodiments described herein, the noise and voltage drop conditions may be represented (e.g., in a database) using an identifier which corresponds to the specific set of neighboring circuits.

BIST may be run on the CUT while BIST is running on the set of circuits (at 404). For example, in FIG. 3, BIST may be run on circuit 308 (i.e., the CUT) while BIST is being run on circuits 306 and 310. Running BIST on circuit 308 while BIST is being run on circuits 306 and 310 enables circuit 308 to be tested under conditions which include noise and voltage drop.

In some embodiments described herein, BIST may be run on the CUT by a first BIST engine, and BIST may be run on at least one circuit in the set of neighboring circuits by a second BIST engine which is different from the first BIST engine. For example, in FIG. 3, BIST may be run on circuit 326 (which may be the CUT) using BIST engine 334, and BIST may be run on circuit 322 by BIST engine 322, where circuit 322 may be one of the circuits in the set of neighboring circuits. In some embodiments described herein, the specific set of neighboring circuits and the shift values may be specified using values stored in one or more registers. For example, a bit-vector may be used to specify the set of neighboring circuits, where each bit in the bit-vector may correspond to a circuit, and where a "1" value in a bit of the bit-vector may indicate that the corresponding circuit is in the set of neighboring circuits. The shift value may be stored as an integer value. Test control circuit 304 may read the values stored in the registers which specify the set of neighboring circuits on which to run BIST and the shift values to use, and then test control circuit 304 may accordingly send instructions to the BIST engines.

A result of running the BIST on the CUT may be determined, and the result may be associated with the noise and voltage drop conditions (at 406). For example, in FIG. 3, the result of running BIST on circuit 308 may be determined and associated with the noise and voltage drop conditions which were generated by running BIST in circuits 306 and 310. Specifically, BIST engine 316 may report the pass/fail result of running BIST on circuit 308, and test control circuit 304 may associate the pass/fail result with the bit-vector value (which indicated that BIST was to be run on neighboring circuits 306 and 310) and the one or more shift values which were used for generating noise and voltage drop conditions in circuit 308. In other words, the noise and voltage drop conditions may be represented by the bit-vector and the one or more shift values which are used for running BIST in the neighboring circuits. If the CUT includes SLM circuitry, then the SLM data may be optionally collected and stored with the BIST pass/fail result.

Figure 5A:
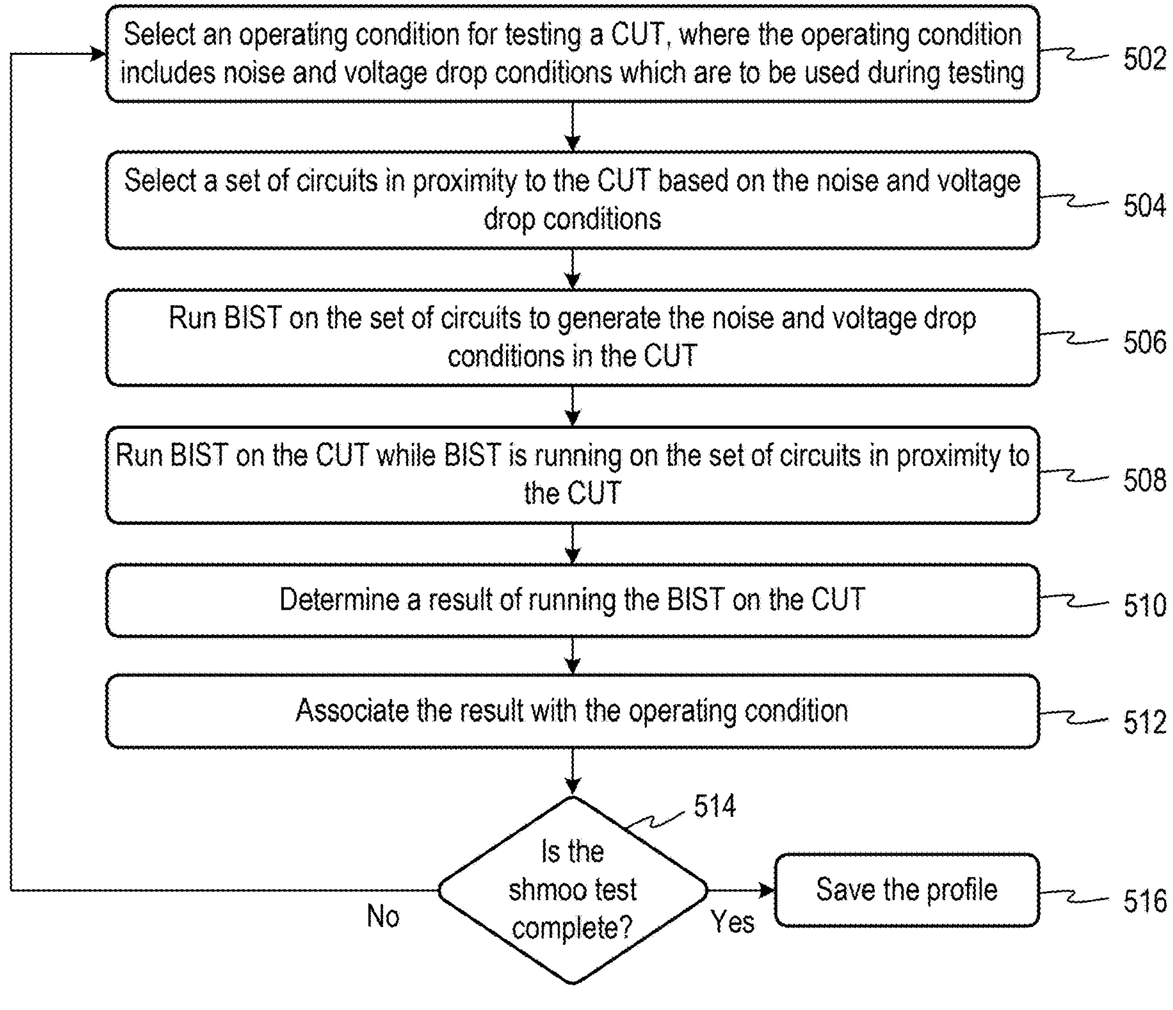
FIG. 5A illustrates a process for performing a shmoo test which includes varying the amount of noise and voltage drop introduced by using neighborhood BIST noise generation in accordance with some embodiments described herein.

FIG. 5A illustrates a process for performing a shmoo test which includes varying the amount of noise and voltage drop introduced by using neighborhood BIST noise generation in accordance with some embodiments described herein.

An operating condition may be selected for testing a CUT, where the operating condition includes noise and voltage drop conditions to be used during testing (at 502). In addition to the noise and voltage drop conditions, the operating condition may include other parameter settings which may include, but are not limited to, a clock frequency, a power supply voltage, and a temperature.

A set of circuits in proximity to the CUT may be selected based on the noise and voltage drop conditions (at 504). Specifically, the noise and voltage drop conditions may be specified by using a bit-vector and/or one or more shift values. The bit-vector may identify the set of circuits in which BIST is to be run, and the one or more shift values may specify the shift values to be used in the set of circuits. Specifically, the one or more shift values may be provided to one or more BIST engines which run BIST on the set of circuits. In some embodiments described herein, a test pattern set, or a functional test may be used instead of BIST.

BIST may be run on the set of circuits to generate the noise and voltage drop conditions in the CUT (at 506). The other parameters may also be set as specified in the operating condition. BIST may be run on the CUT while BIST is running on the set of circuits in proximity to the CUT (at 508).

A result of running the BIST on the CUT (e.g., a pass/fail result) may be determined (at 510), and the result may be associated with the operating condition (at 512). In some embodiments described herein, SLM data may be collected while BIST is run on the CUT, and the SLM data may be associated with the operating condition.

It may be checked if the shmoo test is complete (at 514). If the shmoo test is complete ("Yes" branch), then the profile may be saved (516). On the other hand, if the shmoo test is not complete ("No" branch), then the process may select the next operating condition in the shmoo test (i.e., return to step 502).

In some embodiments described herein, the results of running BIST on the CUT and optionally the SLM data collected over a set of operating conditions may be stored in a first profile associated with the CUT. In some embodiments described herein, a degradation result may be determined based on comparing the first profile associated with the CUT with a second profile associated with the CUT. In some embodiments described herein, a defect result may be determined based on comparing the first profile associated with the CUT with a second profile associated with another CUT. In this disclosure, ordinals (such as "first," "second," etc.) are used to refer to specific instances of an entity and do not indicate relative positions in a sequence. For example, the term "first profile" refers to a specific profile which may be distinct from other profiles but is not necessarily created before, for example, a "second profile."

Figure 5B:
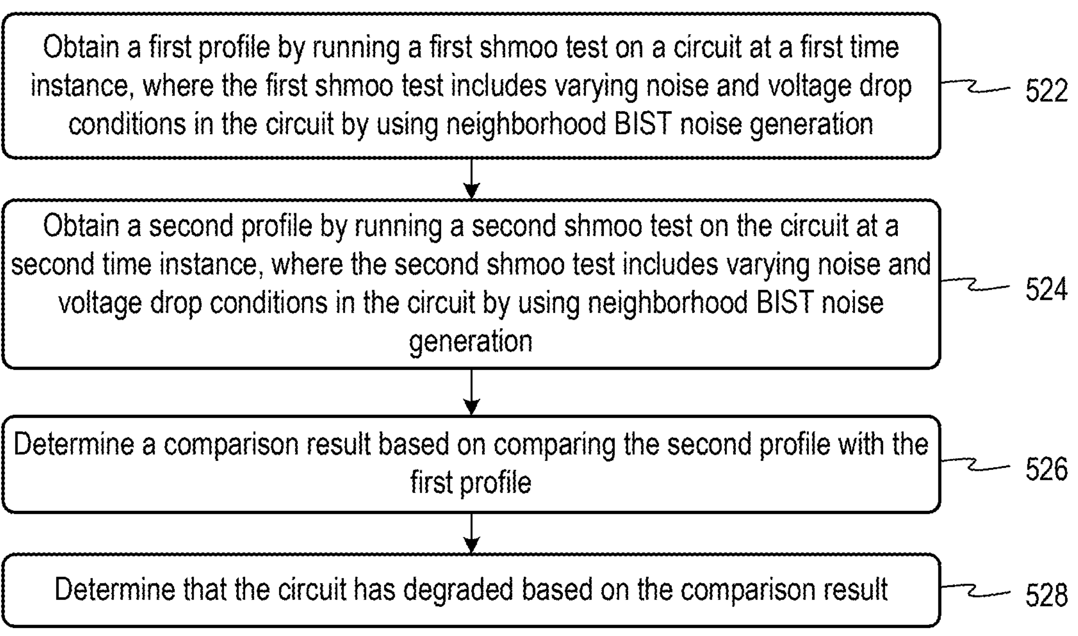
FIG. 5B illustrates a process for detecting a degradation in a circuit in accordance with some embodiments described herein.

FIG. 5B illustrates a process for detecting a degradation in a circuit in accordance with some embodiments described herein.

A first profile may be obtained by running a first shmoo test on a circuit at a first time instance, where the first shmoo test includes varying noise and voltage drop conditions in the circuit by using neighborhood BIST noise generation (at 522). A second profile may be obtained by running a second shmoo test on the circuit at a second time instance, where the second shmoo test includes varying noise and voltage drop conditions in the circuit by using neighborhood BIST noise generation (at 524). A comparison result may be determined by comparing the second profile with the first profile (at 526). It may be determined that the circuit has degraded based on the comparison result (at 528). The first and second shmoo tests may perform the test over the same set of operating conditions. In addition to varying the noise and voltage drop conditions, the first and second shmoo tests may also vary other parameters which may include, but are not limited to, a clock frequency, a power supply voltage, and a temperature. In some embodiments described herein, a test pattern set, or a functional test may be used instead of BIST.

Figure 5C:
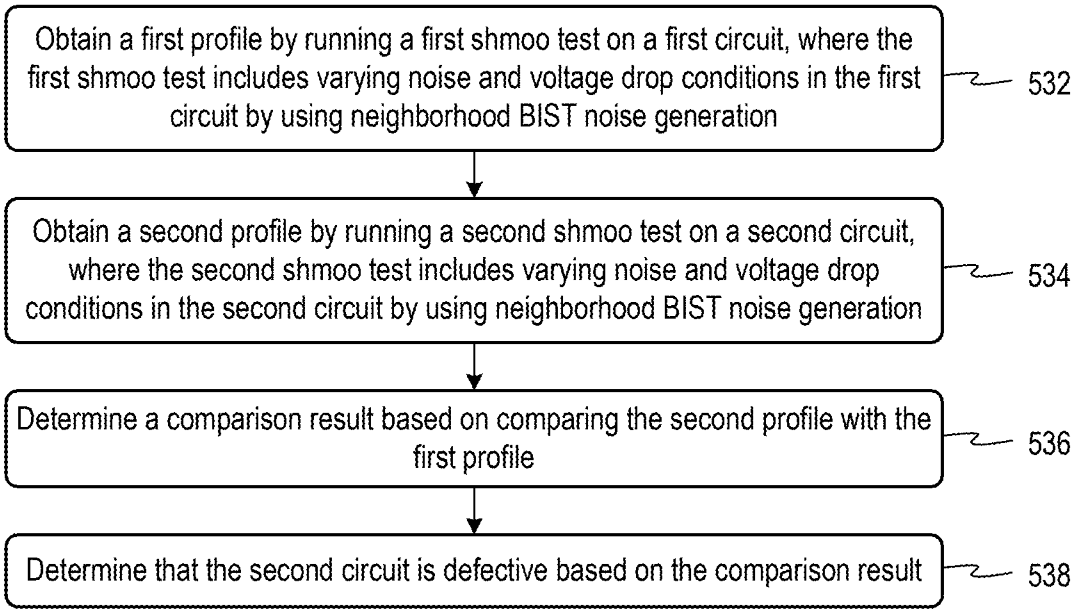
FIG. 5C illustrates a process for detecting a defect in a circuit in accordance with some embodiments described herein.

FIG. 5C illustrates a process for detecting a defect in a circuit in accordance with some embodiments described herein.

A first profile may be obtained by running a first shmoo test on a first circuit, where the first shmoo test includes varying noise and voltage drop conditions in the first circuit by using neighborhood BIST noise generation (at 532). A second profile may be obtained by running a second shmoo test on a second circuit, where the second shmoo test includes varying noise and voltage drop conditions in the second circuit by using neighborhood BIST noise generation (at 534). A comparison result may be determined by comparing the second profile with the first profile (at 536). It may be determined that the second circuit is defective based on the comparison result (at 538). The first and second shmoo tests may perform the test over the same set of operating conditions. In addition to varying the noise and voltage drop conditions, the first and second shmoo tests may also vary other parameters which may include, but are not limited to, a clock frequency, a power supply voltage, and a temperature. In some embodiments described herein, a test pattern set, or a functional test may be used instead of BIST.

Figure 6A:
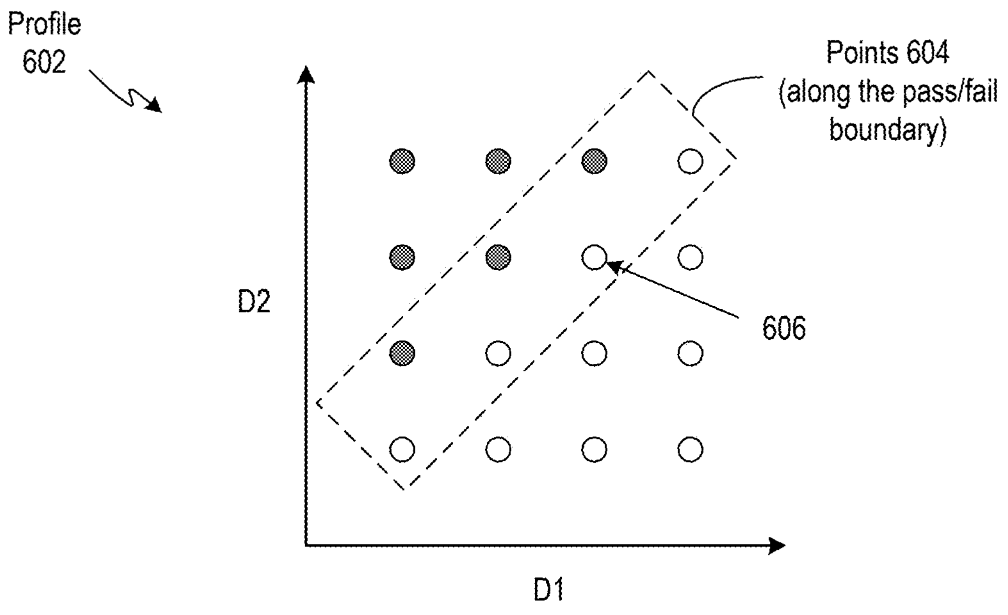
FIGS. 6A-6B illustrate a profile in accordance with some embodiments described herein.
Figure 6B:
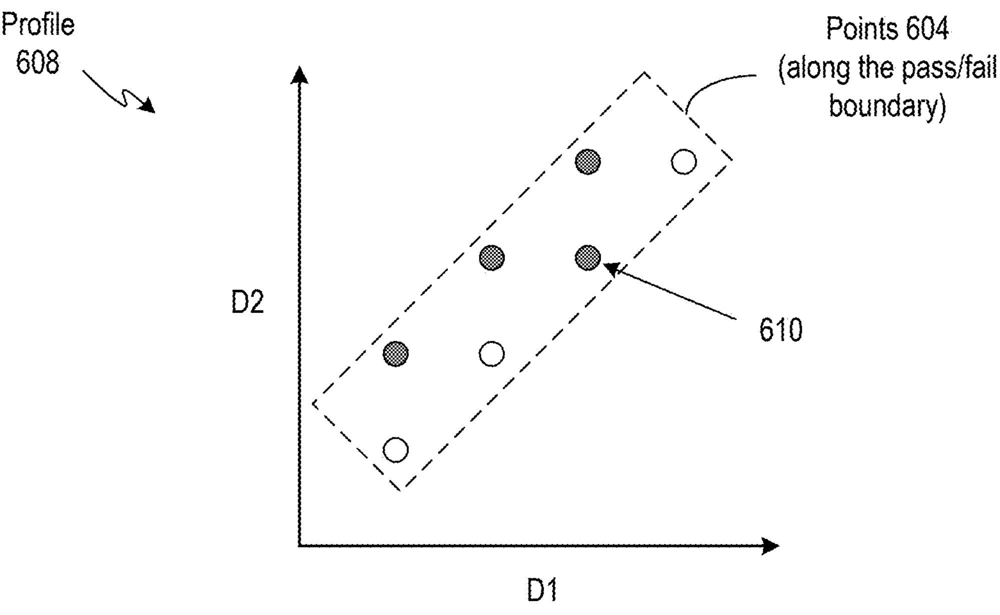

FIGS. 6A-6B illustrate a profile in accordance with some embodiments described herein.

Although profile 602 in FIG. 6A has two dimensions, a profile may generally have multiple dimensions, where each dimension may correspond to a parameter which may be varied during a shmoo test. In FIG. 6A, dimension D1 may correspond to a power supply voltage and dimension D2 may correspond to a clock frequency. Each point (which is represented by a small circle in FIGS. 6A-6B) may correspond to a BIST run for a specific pair of power supply voltage and clock frequency values during a shmoo test. A shaded circle may represent a BIST fail result and an unshaded or open circle may refer to a BIST pass result. The collection of the BIST pass/fail results for a set of points may be saved as the profile for a circuit at a given time.

In some embodiments described herein, a profile may store a subset of points which is near the pass/fail boundary. For example, in FIG. 6A, points 604 are along the pass/fail boundary. Specifically, BIST may be run for an entire range of points, e.g., all the 16 points shown in FIG. 6A. A subset of points (e.g., points 604) may then be identified which lie along the pass/fail boundary, and the subset of points may be used for generating subsequent profiles.

Specifically, once the pass/fail boundary has been identified, profiles may be generated by running BIST on points which lie along the pass/fail boundary. The profiles may then be compared to detect circuits which are of a lower quality or detect degradation in a circuit over time. For example, profile 608 may be obtained for another circuit or for the same circuit at a later point in time. Point 606 in profile 602 had a BIST pass result, whereas corresponding point 610 in profile 608 has a BIST fail result. It may be determined that the circuit corresponding to profile 608 is of a lower quality compared with the circuit corresponding to profile 606. If profiles 606 and 608 were generated for the same circuit, then it may be determined that the circuit has degraded.

Embodiments described herein may have multiple use cases. In some use cases, the tester profile may be made to match the field profile, which may help to ensure that the circuit is tested under conditions that are known to exist in the field. In other words, by purposely degrading the tester environment (by applying noise, voltage, frequency, temperature, or other condition) which is more closely aligned with the profile of a nominal device in the field, defects might be detected that were otherwise not detectable. Even simply noting that the field profile differs from the manufacturing tester profile is knowledge a supplier could use to help force marginal devices to fail that normally would not, absent this knowledge (and adjusting the test environment to force these marginal devices to fail).

In some use cases, outliers on the factory floor may be discovered by checking tests using profiles that normally do pass but are on the fringes of a passing profile. A small selection of devices may go through the entire or a partial shmoo process to build a profile per wafer to characterize the wafer.

In some use cases, the device profile developed at the start of its in-field service may be saved. Then, in the future, the device may perform shmoo testing and compare the resulting profile with the saved profile. The comparison result may be used to determine circuits which have degraded, the reason for their degradation, and any preventive actions that may be taken to prevent eventual failure of the circuits.

Figure 7:
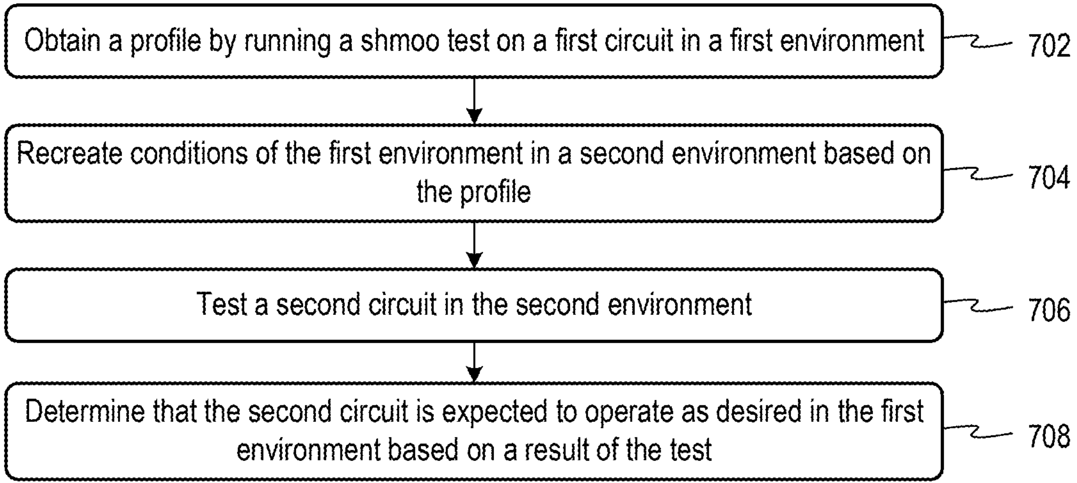
FIG. 7 illustrates a process for using a profile to recreate a field environment in accordance with some embodiments described herein.

FIG. 7 illustrates a process for using a profile to recreate a field environment in accordance with some embodiments described herein.

A profile may be obtained by running a shmoo test on a first circuit in a first environment (at 702). The profile may be obtained by running the shmoo test on a nominal circuit which is deployed in the field, e.g., in a datacenter. The characteristics (e.g., the clock frequency) of a set of manufactured circuits may be distributed over a range of values. The term "nominal circuit" may refer to a circuit with nominal characteristics. The shmoo test may vary one or more parameter settings which may include, but are not limited to, noise and voltage drop conditions, a clock frequency, a power supply voltage, and a temperature. The profile may also include SLM data when available. The conditions of the first environment may be recreated in a second environment based on the profile (at 704). In particular, the conditions of the field environment may be recreated in a test environment based on the profile (which may include SLM data). For example, the settings of one or more parameters in the test environment may be selected so that a profile generated by performing a shmoo test on a nominal circuit in the test environment matches the profile obtained from the field environment.

A second circuit may be tested in the second environment (at 706). For example, a second circuit may be tested (which may be a shmoo test) in the test environment using the parameter settings which were determined based on the profile, and which mimic the conditions in the field environment. It may be determined that the second circuit is expected to operate as desired in the first environment based on a result of the test (at 708). For example, if the second circuit passes the test (which may be a shmoo test), then it may be determined that the second circuit may be deployed in the first environment because the second circuit is expected to operate as desired in the first environment. On the other hand, if the second circuit fails the test (which may be a shmoo test), then it may be determined that the second circuit should not be deployed in the first environment because the second circuit is not expected to operate as desired in the first environment.

In some embodiments described herein, BIST may be run on a set of circuits in proximity to a CUT in an IC chip to generate noise and voltage drop conditions in the CUT. BIST may be run on the CUT while BIST is running on the set of circuits in proximity to the CUT. A result of running the BIST on the CUT may be determined. The result may be associated with the noise and voltage drop conditions.

In some embodiments described herein, the noise and voltage drop conditions may be represented using an identifier which corresponds to the set of circuits. The identifier may include a bit-vector, where a bit in the bit-vector corresponds to a circuit in the set of circuits. In some embodiments described herein, the identifier may include shift values which are used to run BIST in the set of circuits.

In some embodiments described herein, BIST may be run on the CUT by a first BIST engine. BIST may be run on at least one circuit in the set of circuits by a second BIST engine which is different from the first BIST engine.

In some embodiments described herein, a first profile associated with a first circuit may be obtained by running a first shmoo test on the first circuit. Running the first shmoo test on the first circuit may include: selecting an operating condition for testing the first circuit, where the operating condition includes noise and voltage drop conditions to be used during testing; selecting a set of circuits in proximity to the first circuit based on the noise and voltage drop conditions; running BIST on the set of circuits to generate the noise and voltage drop conditions in the first circuit; running BIST on the first circuit while BIST is running on the set of circuits; determining a first result of running the BIST on the first circuit; and associating the first result with the operating condition. In some embodiments described herein, the operating condition may additionally include one or more of a clock frequency, a power supply voltage, and a temperature. The noise and voltage drop conditions may be represented using an identifier which corresponds to the set of circuits. The identifier may include a bit-vector, where a bit in the bit-vector corresponds to a circuit in the set of circuits. The identifier may include shift values which are used to run BIST in the set of circuits.

In some embodiments described herein, running the first shmoo test on the first circuit may include collecting silicon lifecycle management (SLM) measurement data for the first circuit while BIST is running on the first circuit, and associating the SLM measurement data with the operating condition.

In some embodiments described herein, the first shmoo test may be run on the first circuit at a first time instance. In these embodiments, a second profile associate with the first circuit may be obtained by running a second shmoo test on the first circuit at a second time instance, where the second shmoo test may include varying noise and voltage drop conditions in the first circuit by using neighborhood BIST noise generation. A second result may be determined based on comparing the second profile with the first profile. It may be determined that the first circuit has degraded based on the second result.

In some embodiments described herein, a second profile associated with a second circuit may be obtained by running a second shmoo test on the second circuit, where the second shmoo test includes varying noise and voltage drop conditions in the second circuit by using neighborhood BIST noise generation. A second result may be determined based on comparing the second profile with the first profile. It may be determined that the second circuit is defective based on the second result.

In some embodiments described herein, the first shmoo test may be run on the first circuit in a first environment. In these embodiments, conditions of the first environment may be recreated in a second environment based on the first profile. A second result may be obtained based on testing a second circuit in the second environment. It may be determined that the second circuit is expected to operate as desired in the first environment based on the second result. Specifically, recreating the conditions of the first environment in the second environment may include setting one or more parameters in the second environment so that a second profile obtained by running a second shmoo test on a third circuit matches the first profile, and where the characteristics of the third circuit are substantially same as the characteristics of the first circuit.

Figure 8:
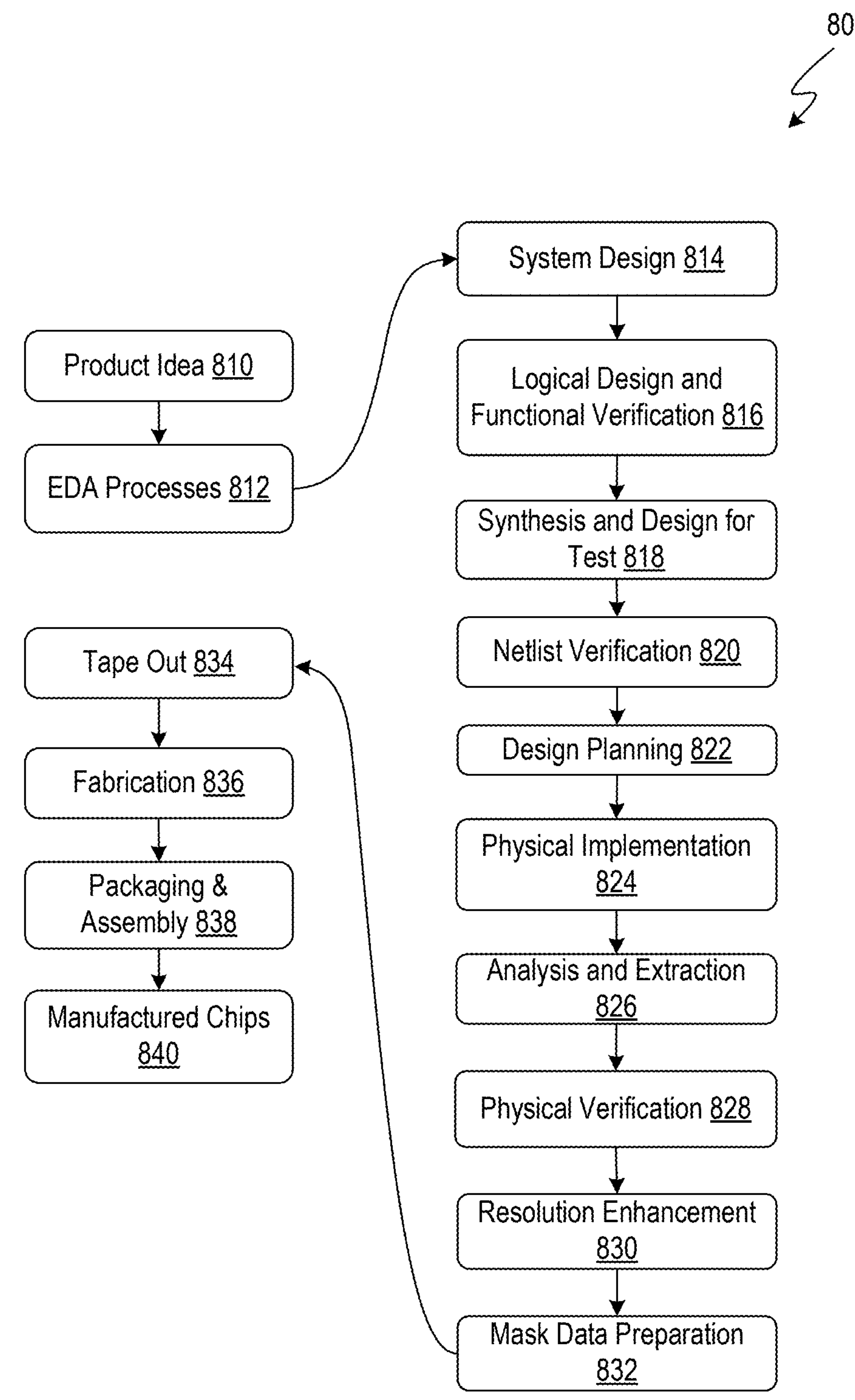
FIG. 8 illustrates an example set of processes used during the design, verification, and fabrication of an article of manufacture such as an integrated circuit to transform and verify design data and instructions that represent the integrated circuit.

FIG. 8 illustrates an example set of processes 800 used during the design, verification, and fabrication of an article of manufacture such as an integrated circuit to transform and verify design data and instructions that represent the integrated circuit.

Each of these processes can be structured and enabled as multiple modules or operations. The term 'EDA' signifies the term 'Electronic Design Automation.' These processes start with the creation of a product idea 810 with information supplied by a designer, information which is transformed to create an article of manufacture that uses a set of EDA processes 812. When the design is finalized, the design is taped-out 834, which is when artwork (e.g., geometric patterns) for the integrated circuit is sent to a fabrication facility to manufacture the mask set, which is then used to manufacture the integrated circuit. After tape-out, a semiconductor die is fabricated 836 and packaging and assembly processes 838 are performed to produce the finished integrated circuit 840.

Specifications for a circuit or electronic structure may range from low-level transistor material layouts to high-level description languages. A high-level of representation may be used to design circuits and systems, using a hardware description language ('HDL') such as VHDL, Verilog, System Verilog, SystemC, MyHDL or Open Vera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 8. The processes described by be enabled by EDA products (or EDA systems).

During system design 814, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 816, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 818, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 820, the netlist is checked for compliance with timing constraints and for correspondence with the HDL code. During design planning 822, an overall floor plan for the integrated circuit is constructed and analyzed for timing and top-level routing.

During layout or physical implementation 824, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 826, the circuit function is verified at the layout level, which permits refinement of the layout design. During physical verification 828, the layout design is checked to ensure that manufacturing constraints are correct, such as DRC constraints, electrical constraints, lithographic constraints, and that circuitry function matches the HDL design specification. During resolution enhancement 830, the geometry of the layout is transformed to improve how the circuit design is manufactured.

During tape-out, data is created to be used (after lithographic enhancements are applied if appropriate) for production of lithography masks. During mask data preparation 832, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 9:
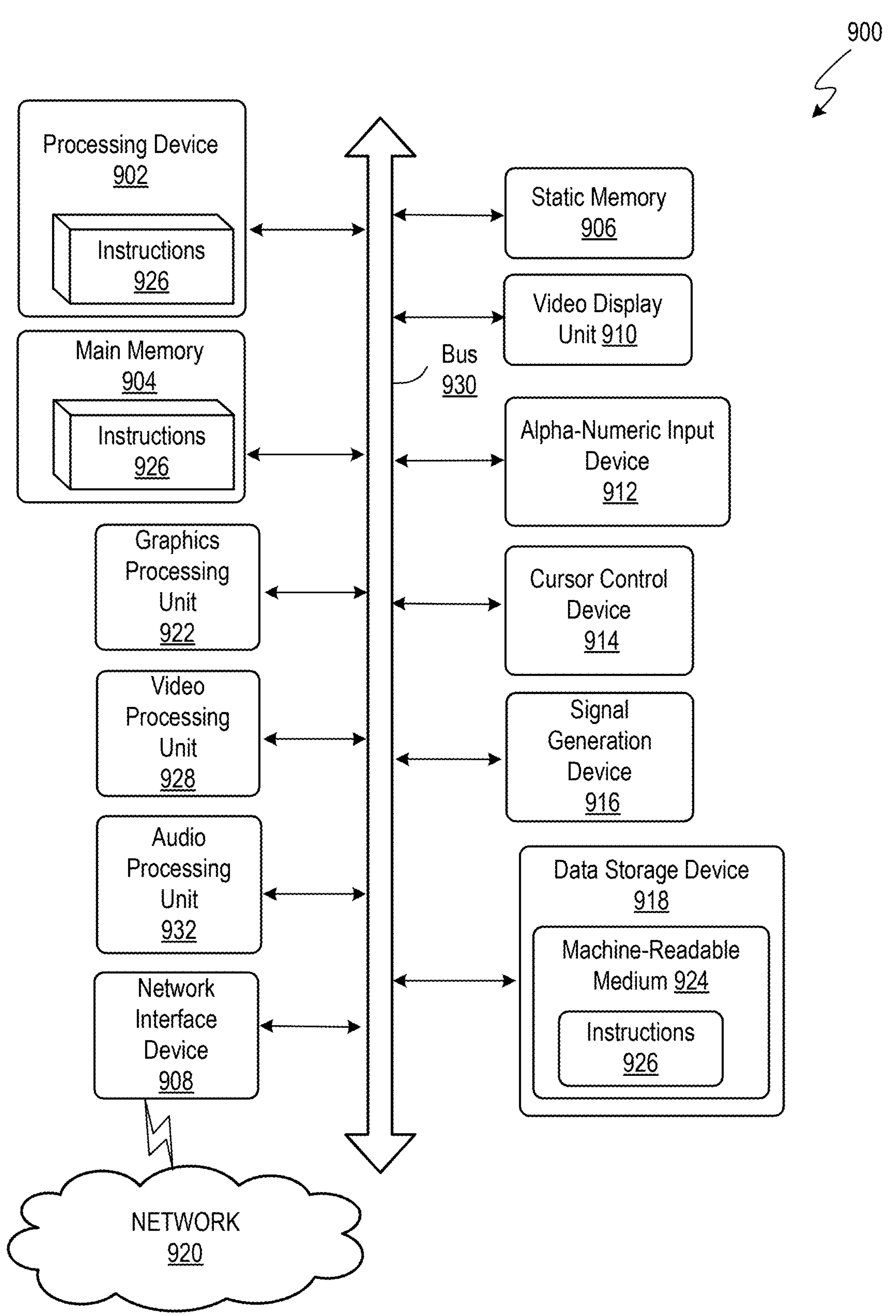
FIG. 9 illustrates an example machine of a computer system within which a set of instructions, for causing the machine to perform any one or more of the methodologies discussed herein, may be executed.

FIG. 9 illustrates an example machine of a computer system 900 within which a set of instructions, for causing the machine to perform any one or more of the methodologies discussed herein, may be executed.

In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:

obtaining a first profile associated with a first circuit by running a first test on the first circuit, wherein running the first test on the first circuit comprises:

selecting an operating condition for testing the first circuit, wherein the operating condition for testing the first circuit includes noise and voltage drop conditions to be used during testing;

selecting a set of circuits in proximity to the first circuit based on the noise and voltage drop conditions;

running built-in self-test (BIST) on the set of circuits in proximity to the first circuit to generate the noise and voltage drop conditions in the first circuit;

running BIST on the first circuit while BIST is running on the set of circuits in proximity to the first circuit;

determining a first result of running the BIST on the first circuit; and associating the first result of running the BIST on the first circuit with the operating condition for testing the first circuit.

2. The method of claim 1, wherein the operating condition for testing the first circuit includes one or more of a clock frequency, a power supply voltage, and a temperature.

3. The method of claim 1, wherein running the first test on the first circuit comprises:

collecting silicon lifecycle management (SLM) measurement data for the first circuit while BIST is running on the first circuit; and associating the SLM measurement data with the operating condition.

4. The method of claim 1, wherein running the first test on the first circuit includes running the first test on the first circuit at a first time instance, and wherein the method further comprises:

obtaining a second profile associated with the first circuit by running a second test on the first circuit at a second time instance, wherein the second test includes varying noise and voltage drop conditions in the first circuit by using neighborhood BIST noise generation;

determining a second result based on comparing the second profile with the first profile associated with the first circuit; and determining that the first circuit has degraded based on the second result.

5. The method of claim 1, further comprising:

obtaining a second profile associated with a second circuit by running a second test on the second circuit, wherein the second test includes varying noise and voltage drop conditions in the second circuit by using neighborhood BIST noise generation;

determining a second result based on comparing the second profile with the first profile associated with the first circuit; and determining that the second circuit is defective based on the second result.

6. The method of claim 1, wherein running the first test on the first circuit includes running the first test on the first circuit in a first environment, and wherein the method comprises:

recreating conditions of the first environment in a second environment based on the first profile associated with the first circuit;

obtaining a second result based on testing a second circuit in the second environment; and determining that the second circuit is expected to operate as desired in the first environment based on the second result.

7. The method of claim 6, wherein recreating the conditions of the first environment in the second environment comprises setting one or more parameters in the second environment so that a second profile obtained by running a second test on a third circuit matches the first profile associated with the first circuit, and wherein characteristics of the third circuit are substantially same as characteristics of the first circuit.

8. The method of claim 1, wherein the noise and voltage drop conditions are represented using an identifier which corresponds to the set of circuits in proximity to the first circuit.

9. The method of claim 8, wherein the identifier is a bit-vector, and wherein a bit in the bit-vector corresponds to a circuit in the set of circuits in proximity to the first circuit.

10. The method of claim 1, wherein the noise and voltage drop conditions are represented using an identifier which specifies shift values which are used to run BIST in the set of circuits in proximity to the first circuit.

11. A system, comprising:

a control circuit to obtain a first profile associated with a first circuit by running a first shmoo test on the first circuit, wherein running the first shmoo test on the first circuit comprises:

selecting an operating condition for testing the first circuit, wherein the operating condition for testing the first circuit includes noise and voltage drop conditions to be used during testing;

selecting a set of circuits in proximity to the first circuit based on the noise and voltage drop conditions;

running built-in self-test (BIST) on the set of circuits to generate the noise and voltage drop conditions in the first circuit in proximity to the first circuit;

running BIST on the first circuit while BIST is running on the set of circuits in proximity to the first circuit;

determining a first result of running the BIST on the first circuit; and associating the first result of running the BIST on the first circuit with the operating condition for testing the first circuit.

12. The system of claim 11, wherein the operating condition for testing the first circuit includes one or more of a clock frequency, a power supply voltage, and a temperature.

13. The system of claim 11, wherein running the first shmoo test on the first circuit comprises:

collecting silicon lifecycle management (SLM) measurement data for the first circuit while BIST is running on the first circuit; and associating the SLM measurement data with the operating condition.

14. The system of claim 11, wherein running the first shmoo test on the first circuit includes running the first shmoo test on the first circuit at a first time instance, and wherein the control circuit further to:

obtain a second profile associated with the first circuit by running a second shmoo test on the first circuit at a second time instance, wherein the second shmoo test includes varying noise and voltage drop conditions in the first circuit by using neighborhood BIST noise generation;

determine a second result based on comparing the second profile with the first profile associated with the first circuit; and determine that the first circuit has degraded based on the second result.

15. The system of claim 11, wherein the control circuit further to:

obtain a second profile associated with a second circuit by running a second shmoo test on the second circuit, wherein the second shmoo test includes varying noise and voltage drop conditions in the second circuit by using neighborhood BIST noise generation;

determine a second result based on comparing the second profile with the first profile associated with the first circuit; and determine that the second circuit is defective based on the second result.

16. A non-transitory computer-readable medium comprising stored instructions, which when executed by a processor, cause the processor to generate a digital representation of an integrated circuit (IC), the IC comprising:

a control circuit to obtain a first profile associated with a first circuit by running a first shmoo test on the first circuit, wherein running the first shmoo test on the first circuit comprises:

selecting an operating condition for testing the first circuit, wherein the operating condition for testing the first circuit includes noise and voltage drop conditions to be used during testing;

selecting a set of circuits in proximity to the first circuit based on the noise and voltage drop conditions, wherein the noise and voltage drop conditions are represented using an identifier which corresponds to the set of circuits in proximity to the first circuit;

running built-in self-test (BIST) on the set of circuits to generate the noise and voltage drop conditions in the first circuit;

running BIST on the first circuit while BIST is running on the set of circuits in proximity to the first circuit;

determining a first result of running the BIST on the first circuit; and associating the first result of running the BIST on the first circuit with the operating condition for testing the first circuit.

17. The non-transitory computer-readable medium of claim 16, wherein the operating condition for testing the first circuit includes one or more of a clock frequency, a power supply voltage, and a temperature.

18. The non-transitory computer-readable medium of claim 16, wherein running the first shmoo test on the first circuit comprises:

collecting silicon lifecycle management (SLM) measurement data for the first circuit while BIST is running on the first circuit; and associating the SLM measurement data with the operating condition.

19. The non-transitory computer-readable medium of claim 16, wherein running the first shmoo test on the first circuit includes running the first shmoo test on the first circuit at a first time instance, and wherein the control circuit further to:

obtain a second profile associated with the first circuit by running a second shmoo test on the first circuit at a second time instance, wherein the second shmoo test includes varying noise and voltage drop conditions in the first circuit by using neighborhood BIST noise generation;

determine a second result based on comparing the second profile with the first profile associated with the first circuit; and determine that the first circuit has degraded based on the second result.

20. The non-transitory computer-readable medium of claim 16, wherein the control circuit further to:

obtain a second profile associated with a second circuit by running a second shmoo test on the second circuit, wherein the second shmoo test includes varying noise and voltage drop conditions in the second circuit by using neighborhood BIST noise generation;

determine a second result based on comparing the second profile with the first profile associated with the first circuit; and determine that the second circuit is defective based on the second result.

* * * * *